Dec. 9, 1969 P. W. CRONKHITE 3,482,682

RETAINING TRAYS FOR SEMICONDUCTOR WAFERS AND THE LIKE

Filed Oct. 2, 1968 2 Sheets-Sheet 1

INVENTOR
PAUL W. CRONKHITE

BY

Robert J. Schaap

ATTORNEY

RETAINING TRAYS FOR SEMICONDUCTOR WAFERS AND THE LIKE

Filed Oct. 2, 1968 2 Sheets-Sheet 2

INVENTOR
PAUL W. CRONKHITE

BY Robert J. Schaap

ATTORNEY

United States Patent Office 3,482,682
Patented Dec. 9, 1969

3,482,682
RETAINING TRAYS FOR SEMICONDUCTOR WAFERS AND THE LIKE

Paul W. Cronkhite, St. Charles, Mo., assignor to Monsanto Company, St. Louis, Mo., a corporation of Delaware Continuation-in-part of application Ser. No. 644,966, June 9, 1967. This application Oct. 2, 1968, Ser. No. 764,472
Int. Cl. B65d *81/00, 1/36, 21/02*
U.S. Cl. 206—65 23 Claims

ABSTRACT OF THE DISCLOSURE

A series of marginally registrable plastic trays having a plurality of wells and wherein each well is provided with a tapered wall for supporting a wafer within the well. The wall is tapered so that the bottom thereof is smaller than the wafer and this prevents the polished face of the wafer from contacting any surface of the tray. A cap member is removably disposed upon a rim-forming element of each well. Each cap has a recessed portion which engages the upwardly presented surface of the wafer, thereby holding the same in a substantially immobile position in the well. Each of the trays is registrable with like trays so that a series of these trays can be stacked, wrapped and shipped as a unit.

DISCLOSURE

This application is a continuation-in-part of my copending application, Ser. No. 644,966, filed June 9, 1967, now abandoned.

This invention relates in general to certain new and useful improvements in devices for storing and transporting semiconductor wafers, and more specifically to a plurality of registrable trays which are capable of accommodating a plurality of wafers.

In recent years, semiconductor devices such as silicon controlled rectifiers have found widespread use in the electronics industry. These semiconductor devices are made from semiconductor materials which may have a plurality of layers of semiconductor material having different conductivities and separated by a transition zone. Semiconductor materials of this type having at least two layers of different conductivities with a transition region therebetween are very suitable for use in the formation of electronic members such as diodes, transistors, switches and similar types of electronic structure. One very effective method of producing semiconductor materials is by the epitaxial deposition of silicon on a substrate wafer formed of like material. Generally, the wafers involved must be formed of single crystal silicon with precisely controlled concentrations of doping impurities.

Frequently, the semiconductor wafers have a highly polished surface which must remain free from contact with any foreign surface whatsoever during storage and transporting thereof. It has generally been found that when this polished surface contacts any foreign surface, the surface tends to become contaminated and marred. These slight marrings of the surface and the impurities often materially interfere with effective further processing of the wafers such as growth of epitaxial layers of fabrication of semiconductor devices. In the past, transporting of the wafer between steps in processing thereof has often caused serious problems since it was not always possible to maintain the wafers in a substantially clean atmospheric environment. Furthermore, accidental contact with the surface of the wafer often occurred through inadvertence which, in effect, made subsequent processing steps futile and destroyed the value of the semiconductor wafer.

These problems were even more severe during shipping of the wafers to the purchasers thereof. Generally, each of the wafers had to be enclosed in a specially designed bag of plastic or paper which was treated in order to eliminate impurities. Even in this type of container, it was impossible to prevent contact of the wafer surface with the bag, per se. It was necessary to wrap these wafers and stack them in such manner that a minimum of movement could be obtained. However, due to this technique, the surface of a number of the wafers was often contaminated by the time they were received by the user thereof. Accordingly, the various methods heretofore employed for the handling, shipment and storage of semiconductor wafers have not been very effective.

It is, therefore, the primary object of the present invention to provide a series of marginally registrable nestable trays which are capable of carrying semiconductor wafers in such manner that the critical surfaces of the semiconductor wafers do not contact any foreign surface.

It is another object of the present invention to provide a series of retaining trays of the type stated which can be manufactured in a mass-production operation and are capable of being constructed with desired tolerance so that adverse surface conditions are not created on the semiconductor wafers carried therein.

It is also an object of the present invention to provide a retaining tray of the type stated for a plurality of wafer diameters.

It is a further object of the present invention to provide retaining trays of the type stated which are specifically designed so that inadvertent handling of the wafers will not cause injury thereof in the retaining trays.

It is an additional object of the present invention to provide retaining trays of the type stated which are disposable and which can be manufactured at a relatively low unit cost.

With the above and other objects in view, my invention resides in the novel features of form, construction, combination and arrangement of parts presently described and pointed out in the claims.

GENERAL DESCRIPTION

The present invention relates to a series of registrable retaining trays which are designed to carry semiconductor wafers having a highly polished or epitaxial surface. Each of the retaining trays is preferably made of a somewhat rigid but yet sufficiently flexible material. The trays are formed with a plurality of upstanding circular bosses which are substantially hollow in the provision of wafer retaining wells. The retaining wells include an inwardly extending shoulder which merges into an inwardly tapered wall section, which is designed in such manner that a wafer disposed within the well with the critical surface presented in a generally downward position does not contact any surface of the well. In essence, the tapered wall section is so-designed that only the peripheral margins of the wafer come into contact with any portion of the well. When the wafer is disposed in a substantially horizontal position, the peripheral margins of the entire surface of the wafer will frictionally engage the tapered wall section at the proper diametral cross section. In this position, the wafer is spaced from the bottom wall of the retaining well.

Each of the bosses is provided with an annular bead at its upper end and is adapted to receive a snap-fitting lid or cover member. Each of the lids is provided with a circular annular shoulder for engaging the boss and an inwardly struck engaging finger so that the lid may be snap-fitted over the bead of the boss in a fairly tight position. Furthermore, the lid is provided with a downwardly extending central portion which engages the upwardly presented surface of the wafer and, thereby holds the same in a substantially immobile position in the retaining well. The portions of the supporting surface extending between each of the retaining wells is sized to fit snugly between the upwardly extending bosses of a marginally registered tray disposed therebeneath. In this manner, it is possible to marginally align each of the trays during a vertical stacking operation. Furthermore, the portions of the trays which extend between adjacent bosses will fit snugly therein so that each of the trays can be stacked in marginal registration.

The present invention also provides a modified form of wafer retaining tray which includes a support plate and a plurality of upstanding bosses, each being hollowed in the form of a wafer retaining well. In this embodiment of the wafer retaining tray, the upstanding boss is provided with an annular bead which is somewhat rectangular in horizontal cross section. The upstanding boss is provided with an annular groove for engaging an inwardly extending annular finger formed on a removable cap.

DETAILED DESCRIPTION

Figure 1:
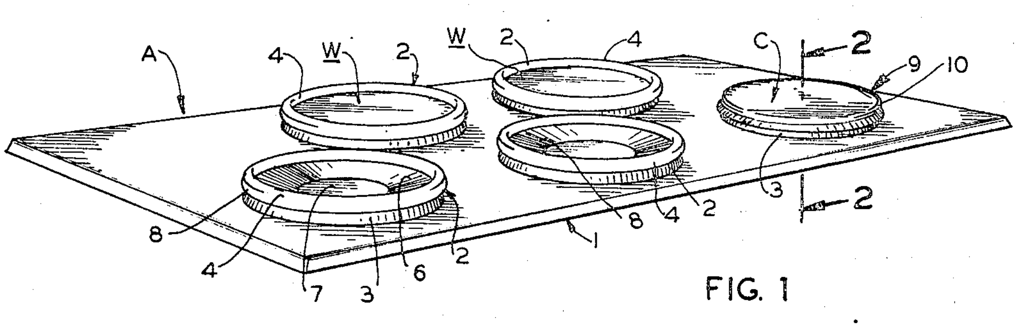
FIGURE 1 is a perspective view of a retaining tray which is constructed in accordance with and embodies the present invention, and showing a plurality of wafers disposed therein and caps removably disposed over some of the retaining wells.

Referring now in more detail and by reference characters to the drawings A designates a retaining tray constructed in accordance with the present invention. The retaining tray A generally comprises a relatively flat sheet or so-called "support plate" 1 which is integrally formed with two rows of upstanding bosses 2 having a total of five bosses in the manner as illustrated in FIGURE 1. It should be recognized, however, that the sheet 1 could be preformed with any desired number of bosses and the invention is not limited to the number of bosses illustrated or to the specific pattern in which they are formed in the retaining sheet 1.

Figure 2:
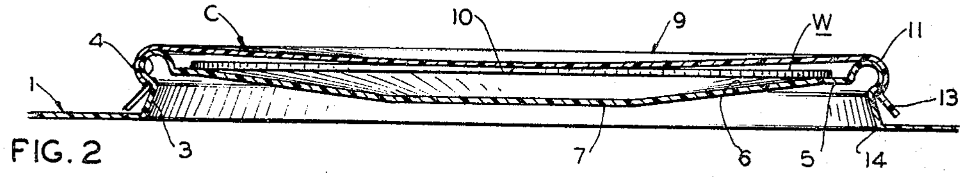
FIGURE 2 is a fragmentary vertical sectional view taken along line 2—2 of FIGURE 1.

Each of the bosses 2 is formed with an inwardly and upwardly extending annular side wall 3 which integrally merges into an enlarged annularly extending somewhat circular bead 4 at its upper end in the manner as illustrated in FIGURE 2. The circular bead 4, in turn, merges into an inwardly presented annular shoulder 5, which is in turn integrally formed with a downwardly and inwardly extending tapered wall 6. By reference to FIGURE 2, it can be seen that the tapered wall 6 is diametrally larger than a wafer W at its upper end and is diametrally smaller than the wafer W at its lower end. The tapered wall 6, in turn, merges at its lower end into a slightly convex bottom wall 7. Thus, it can be seen that the hollowed portion of the boss 3 serves as a retaining well 8 for accommodation of wafers W of a specific size.

The bottom wall 7 is slightly diametrally smaller than a semiconductor wafer W, which is to be disposed within the retaining well 8. Accordingly, it can be seen that a wafer W which is disposed therein in a position substantially parallel to the bottom wall 7 is supported on the tapered wall 6. It should also be understood that the bottom wall 7 could be hemispherical in shape in accordance with the present invention.

Generally, the retaining tray A of the present invention was designed for use with polished silicon semiconductor wafers. However, the invention is by no means limited to these types of wafers and the various applications thereof are set forth in more detail hereinafter. For purposes of illustration and description of the present invention, it may be assumed that the wafers are, for example, silicon wafers with an epitaxial silicon coating formed thereon. This epitaxial silicon surface is the critical surface which must be maintained in a dust-free atmosphere. The preparation of the epitaxial silicon surface involves a great deal of time-consuming preparations and is very costly. It has been found that even slight contact with this surface is often sufficient to abrade the surface to an extent where it is no longer usable for the manufacture of semiconductor devices. In addition, it has also been found that mere momentary touching of the wafer by a fingertip will also create sufficient contamination on the surface thereof that it may be rendered unusable. The same problems hold true for semiconductor wafers with highly polished surfaces. These treated surfaces, which must be protected, are herein referred to as the "critical surfaces." The retaining tray A of the present invention was designed to specifically overcome these problems.

Figure 5:
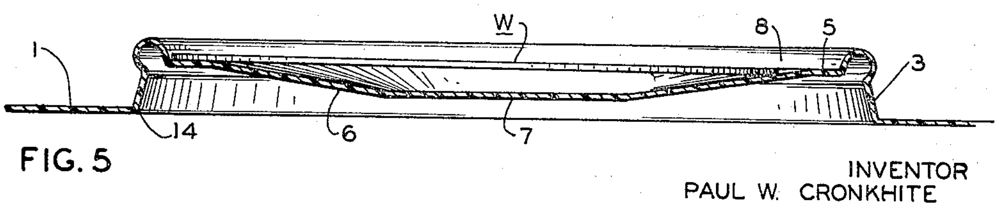
FIGURE 5 is a fragmentary vertical sectional view similar to the sectional view of FIGURE 2 and showing a wafer disposed therein in such manner that it is not parallel to the bottom wall of the retaining well.
Figure 7:
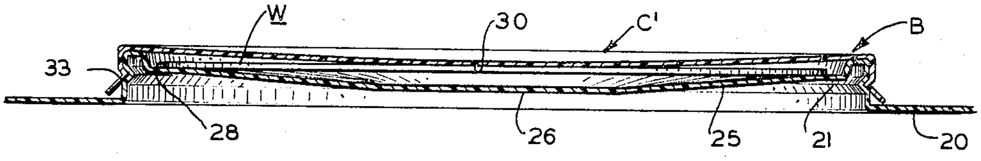
FIGURE 7 is a fragmentary vertical sectional view similar to the sectional view of FIGURE 6 with lids disposed over each of the retaining wells.

By reference to FIGURE 5, it can be seen that each of the retaining wells 8 is so constructed that a wafer W disposed therein can be oriented in substantially any position and the substantial position of the epitaxial surface thereof will still remain out of contact with any portion of the walls 6 or 7 in the well 8. In essence, if the tray A should be inadvertently tipped slightly so that the wafer W is no longer supported on the tapered wall 6, it may shift to a position substantially as illustrated in FIGURE 5. For example, it can be seen that the peripheral margin of the wafe W is actually supported in the manner as illustrated in FIGURE 7 and on the spaced points labeled (X). It can be seen that the epitaxial surface of the wafer W will remain out of contact with any portion of the wall of the well 8 and only the peripheral margin of the wafer will contact any portion of the wall of the well 8 at any one time.

In order to maintain brevity, only one of the retaining wells 8 has been described herein and only one has been illustrated in detail in the accompanying drawings. However, it should be recognized after each of the other retaining wells are substantially identical in construction and are, therefore, neither illustrated nor described in detail herein.

Figure 3:
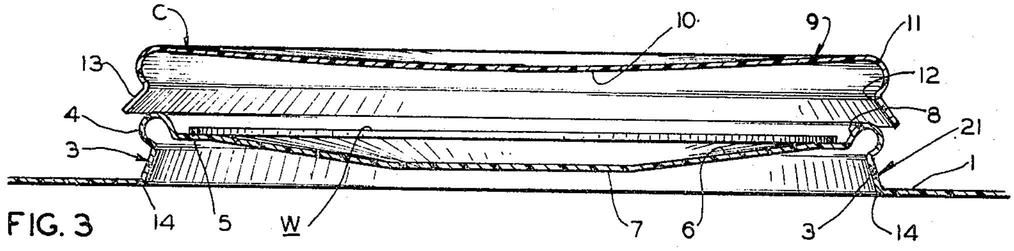
FIGURE 3 is a vertical sectional view similar to the sectional view of FIGURE 2 and showing portions of the retaining well with the well caps removably disposed thereon.

A removable cap C is provided for coverwise disposition over each of the retaining wells 8 in the manner as illustrated in FIGURE 3. The cap C generally comprises a relatively flat top sheet 9, which is slightly frusto-conical or "dish-shaped" so that it forms a downwardly projecting central pressure point 10 which is designed to bear against the upper surface of the wafer W in the manner as illustrated in FIGURE 3. Furthermore, the sheet 9 of the cap C may be hemispherically shaped in accordance with the present invention. The cap C is also provided with a somewhat circular annular peripheral shoulder 11 which integrally merges into the flat sheet 9 and is sized to extend over the annular bead 4. Furthermore, the cap C is formed of the same material as the tray 1 and is, therefore, sufficiently flexible to become snap-fitted over the bead 4 in the manner as illustrated in FIGURE 3. The annular shoulder 11 merges into an inwardly extending annular finger 12 which engages the underside of the bead 4 at its point of integral merger with the side wall 3. Furthermore, the cap C is provided with an annular outwardly flaring flange 13 in the manner as illustrated in FIGURE 3. Thus, it can be seen that the cap C can be engaged by the flange 13 and urged upwardly from its closurewise position on the boss 2 and can be easily reinserted thereon in tight-fitting coverwise disposition. Furthermore, when the cap C is disposed over the well 8 in coverwise disposition, it engages the wafer W and holds the same in a fairly immobile position in the retaining well 8, by urging the same against the tapered wall 6.

Figure 4:
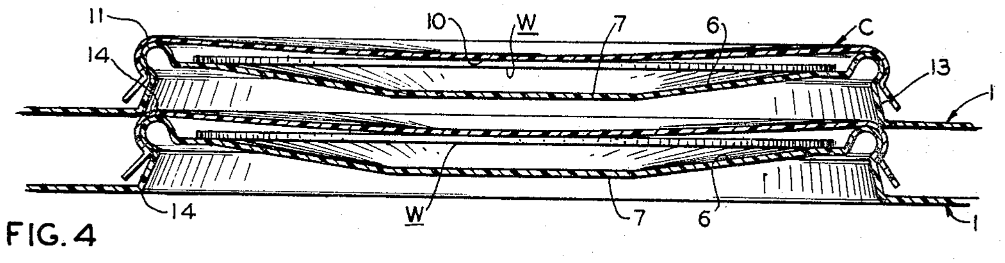
FIGURE 4 is a fragmentary vertical sectional view similar to the sectional view of FIGURE 2 and showing portions of the retaining wells of a pair of stacked trays with wafers disposed therein.

By further reference to FIGURES 1 and 2, it can be seen that the side walls 3 of each of the bosses 2 merge into the support plate 1 through an arcuate section 14. By reference to FIGURE 4, it can be seen that a series of the trays can be stacked in marginal registration so that the arcuate sections 14 of one way fit snugly between the annular beads 4 on a tray disposed immediately therebeneath. This is true even though cover members C are disposed over each of the retaining wells 8. This type of construction also serves to space the retaining wells of one tray from the bottom wall of the tray disposed immediately thereabove. Nevertheless, the trays A can be stacked in marginal registration in the manner as illustrated.

Figure 6:
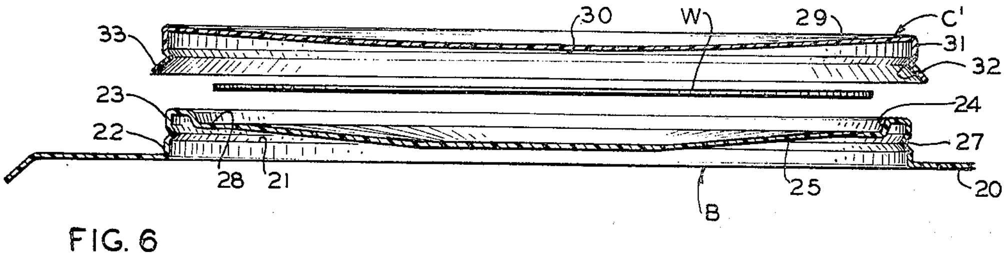
FIGURE 6 is a fragmentary vertical sectional view similar to FIGURE 2 and showing a modified form of wafer retaining trays constructed in accordance with and embodying the present invention.

It is possible to provide a modified form of wafer tray B substantially as illustrated in FIGURES 6 and 7 and which is substantially similar to the wafer retaining tray A. The wafer retaining tray B generally comprises a relatively flat sheet 20 with a plurality of upstanding bosses 21 having a relatively flat annular side wall 22. At its upper end, the annular side wall 22 integrally merges into an annular bead 23 which is substantially rectangular in horizontal cross section. The bead 23 is provided on its interior surface with a vertical shoulder 24, which in turn, merges into an inwardly and downwardly extending tapered side wall 25, for retaining a wafer W thereon. At its lower end, the side wall 25 integrally merges into a slightly convex bottom wall 26. The size and shape of the tapered wall 25 and the bottom wall 26 is substantially similar to the tapered wall 6 and bottom wall 7 respectively of the retaining tray A. However, it is to be noted that the upstanding bead 23 is not rounded in the same manner as the bead 4 in the wafer retaining tray A. Furthermore, each of the bosses 21 is provided with an annular groove 27 in the side wall 22 for reasons which will presently more fully appear. Thus, it can be seen that the recessed portion in each of the upstanding bosses 21 provides a wafer retaining well 28, which is substantially similar to the wafer retaining well 8 in the retaining tray A.

A cap C′, which is substantially similar to the previously described cap C is provided for coverwise disposition over each of the retaining wells 28. The cover member C′ generally comprises a relatively flat sheet 29, which is slightly frusto-conical in shape and provides a downwardly projecting center pressure point 30, which engages the central portion of the upper surface of the wafer W, in the manner as illustrated in FIGURE 7. Furthermore, the flat wall 29 integrally merges into a downwardly extending relatively vertical side wall 31, which is provided with a somewhat V-shaped annular finger 32, the latter being snap-fitted in the groove 27 in the manner as illustrated in FIGURE 7. The vertical side wall 31 integrally merges into an outwardly extending annular flange 33. Thus, it can be seen that the cap C′ can be easily removed from the upstanding boss 21 by merely engaging the flange 33 and pulling the cap C′ from the boss 21. In like manner, the cap C′ can be easily disposed over the wafer retaining well 28 by snap-fitting the same so that the annular finger 32 extends into the annular groove 27 on the boss 21.

The wafer retaining tray B is substantially similar in all other respects to the wafer retaining tray A and is also nestable and marginally registrable with like trays.

Figure 10:
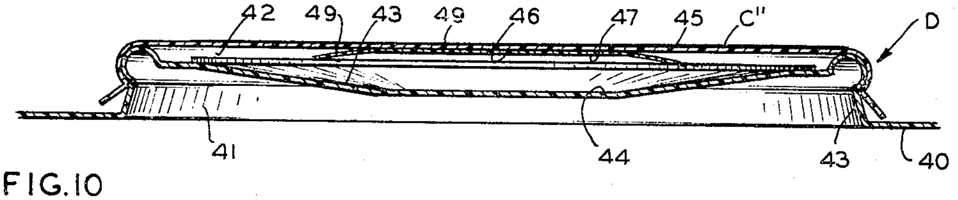
FIGURE 10 is a fragmentary vertical sectional view, similar to FIGURE 2 and showing the employment of the insert in the wafer tray.

It is possible to provide another modified form of wafer tray D, substantially as illustrated in FIGURE 10. The wafer tray D is similar to the wafer tray A and generally comprises a support plate 40, having an upstanding boss 41 integrally formed thereon. The boss 41 is substantially identical to the boss 2 in the tray A and has a recess 42 which is formed by a tapered wall 43 and a bottom wall 44 which are substantially identical in all respects to the similar components in the tray A. In like manner, a removable cap C″ is provided for coverwise disposition over each of the recesses 42 in the manner as illustrated in FIGURE 10. The cap C″ is substantially identical to the cap C and includes a top sheet 45 which is slightly frusto-conical or "dish-shaped' so that it forms a downwardly projecting central pressure point 46. In like manner, the cover member C could have a flat top sheet with no downwardly projecting portion whatsoever.

Figure 8:
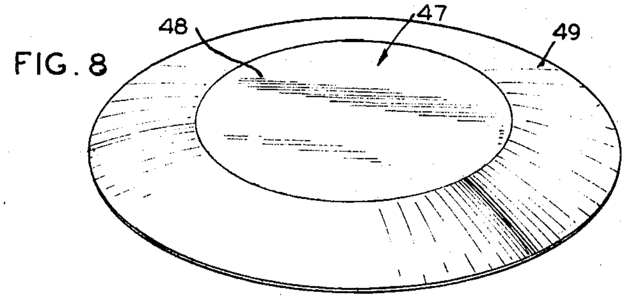
FIGURE 8 is a perspective view of an insert for removable interposition between the cap and a wafer in the tray of FIGURE 1.
Figure 9:
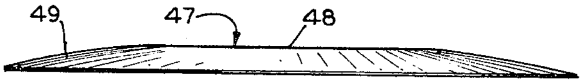
FIGURE 9 is a side elevational view of the insert of FIGURE 8.

Provided for interposition between the lower surface of the top sheet 45 and the upper surface of the wafer W which is disposed in the recess 42 is a disc-like insert 47. By reference to FIGURES 8 and 9, it can be seen that the insert is somewhat in the form of an inverted cup and generally comprises a relatively flat top wall 48 formed with an annular downwardly and outwardly flaring skirt 49. The insert 47 is preferably formed of the same material as the tray D and, therefore, is slightly resilient. Thus, when the flat sheet 45 of the cap C″ bears against the top wall 48 of the disc-like insert 47, the lower peripheral margin of the skirt 49 will engage the upper surface of the wafer W and urge the same downwardly against the tapered wall 43 of the recess 42.

This method of transporting each of the wafers W has been found to be highly successful and has substantially eliminated the problems of contacting the surface of the wafer W with any foreign matter, thereby maintaining a high degree of purity and eliminating any surface abrasion. While the trays of the present invention were specifically designed for use with polished silicon wafers and silicon wafers having epitaxial silicon or oxide coatings thereon, they are also successfully employed with other types of semiconductor wafers, such as gallium arsenide wafers and gallium arsenide phosphide wafers. Furthermore, the trays are equally suitable to hold and transport and store similar slice-shaped objects which have critical surfaces prepared by methods other than machine polishing, objects with critical surfaces which have been prepared by cleaning, chemically etching, vapor etching, deposition from the vapor phase, sputtering, or other thin film techniques, crystallization from the melt, chemical or electrolytical precipitation from solution can also be successfully used in the retaining trays of the present invention. Furthermore, the tray is capable of handling slices of any regular shape, preferably in the form of a flat disc and may consist of materials other than semiconductor materials, such as solid metal and metal alloys and minerals. The wafers which may be used in the trays of the present invention may be formed of glass, quartz, ceramics, sapphire and other precious and semi-precious stones.

When transporting a series of marginally registered stacked trays, the trays may be stored in a hermetically sealable container or simply wrapped in a substantially self-sealing dust-proof foil or plastic film. The trays may then be properly stacked and placed in a suitable shipping container as desired. It should be observed that the wafers W would not be damaged even if the trays A were inadvertently turned over. It can be observed that after the wafers W have been properly inserted into each of the wells 8, they are held in place by the cap C. This type of condition eliminates any possibility of contamination or abrasion to the critical surface of the wafer.

It should be understood that changes and modifications in the form, construction, arrangement and combination of parts presently described and pointed out may be made and substituted for those herein shown without departing from the nature and principle of my invention.

I claim:

1. A device for retaining relatively thin flat semiconductor wafers and the like which have a critical surface and a surface opposed to said critical surface, said device comprising a supporting member, at least one upstanding boss operatively associated with said supporting member and having a recess sized to accommodate semiconductor wafers and the like, said recess having a tapered wall which is connected to said supporting member and forming a recess opening larger than the wafer to be supported in said recess, said tapered wall being connected to a bottom wall which is diametrally smaller than the wafer to be supported in said recess for supporting the wafer in spaced relation to said bottom wall, the angle of taper of said tapered wall being such that a substantial portion of the critical surface of said wafer does not contact any portion of the recess when oriented in substantially any position with respect to said bottom wall, and a cover member removably disposed over said upstanding boss, said cover member having an area which engages the surface of the wafer opposed to said critical surface.

2. The device of claim 1 further characterized in that a plurality of bosses and recesses are operatively associated with said supporting member.

3. The device of claim 1 further characterized in that an annular bead is operatively associated with the upper end of said boss and is sized to engage the cover members disposed thereon.

4. The device of claim 3 further characterized in that each bead is somewhat circular in vertical cross section.

5. The device of claim 3 further characterized in that each bead is somewhat rectangular in vertical cross section.

6. The device of claim 1 wherein said cover member has a dish-shaped wall including a point-like surface which engages the wafer at a point somewhat centrally thereof.

7. A device for retaining relatively thin flat semiconductor wafers and the like which have a critical surface and a surface opposed to said critical surface, said device comprising a supporting member, at least one upstanding boss operatively associated with said supporting member and having a recess sized to accommodate semiconductor wafers and the like, said recess having a tapered wall which is connected to said supporting member and forming a recess opening larger than the wafer to be supported in said recess, said tapered wall being connected to a bottom wall which is diametrally smaller than the wafer to be supported in said recess for supporting the wafer in spaced substantially parallel relation to said bottom wall, the angle of taper of said tapered wall being such that a substantially air-tight pocket is formed between the critical surface of the wafer and the bottom wall to maintain a substantially dust-free atmosphere, and a cover member removably disposed over said upstanding boss, said cover member having an area which engages the surface of the wafer opposed to said critical surface.

8. The device of claim 7 further characterized in that a substantial portion of the critical surface of said wafer does not contact any portion of the recess when oriented in substantially any position with respect to said bottom wall.

9. A device for retaining relatively thin flat semiconductor wafers and the like which have a critical surface and a surface opposed to said critical surface, said device comprising a supporting member, a plurality of upstanding bosses operatively associated with said supporting member and each of said bosses having a recess sized to accommodate semiconductor wafers and the like, each of said recesses having a tapered wall which merges into said supporting member and forms a recess opening larger than the wafer to be supported in said recess, said tapered wall merging into a bottom wall which is diametrally smaller than the wafer to be supported in said recess for supporting the wafer in spaced relation to said bottom wall, the angle of taper of said tapered wall being such that a substantial portion of the critical surface of said wafer does not contact any portion of the recess when oriented in substantially any position with respect to said bottom wall, and a cover member removably disposed over each of said upstanding bosses, each said cover member having an area which engages the surface of the wafer opposed to said critical surface, each of said bosses having a central bore on its underside to receive and accommodate the upstanding boss on a device disposed immediately therebeneath.

10. The device of claim 9 further characterized in that the central bore of each recess is sized to accommodate the cover member and upstanding boss of a device disposed immediately therebeneath.

11. The device of claim 9 further characterized in that the upstanding bosses and central bores on each such device are located so that proper marginal registration is achieved when said devices are stacked in marginal registration.

12. The combination of a device for retaining relatively thin flat semiconductor wafers, said wafers having a critical surface and a surface opposed to said critical surface, said device comprising a supporting member, at least one upstanding boss operatively associated with said supporting member and having a recess, a semiconductor wafer disposed in said recess and being sized to be received and accommodated by said recess, said recess having a tapered wall which is connected to said supporting member and forming a recess opening larger than the wafer supported in said recess, said tapered wall being connected to a bottom wall which is diametrally smaller than the wafer supported therein so that said wafer is supported in spaced relation to said bottom wall, the angle of taper of said tapered wall being such that a substantial portion of the critical surface of said wafer does not contact any portion of the recess when oriented in substantially any position with respect to said botom wall, and a cover member removably disposed over said upstanding boss, said cover member having an area which engages the surface of the wafer opposed to said critical surface.

13. The combination of a device for retaining relatively thin flat semiconductor wafers, said wafers having a critical surface and a surface opposed to said critical surface, said device comprising a supporting member, at least one upstanding boss operatively associated with said supporting member and having a recess, a semiconductor wafer disposed in said recess and being sized to be received and accommodated by said recess, said recess having a tapered wall which is connected to said supporting member and forming a recess opening larger than the wafer supported therein, said tapered wall being connected to a bottom wall which is diametrally smaller than the wafer supported therein so that said wafer is supported in spaced substantially parallel relation to said bottom wall, the angle of taper of said tapered wall being such that a substantially air-tight pocket is formed between the critical surface of said wafer and the bottom wall to maintain a substantiallly dust-free atmosphere, and a cover member removably disposed over said upstanding boss, said cover member having an area which engages the surface of the wafer opposed to said critical surface.

14. The combination of a device for retaining relatively thin flat semiconductor wafers, said wafers having a critical surface and a surface opposed to said critical surface, said device comprising a supporting member, a plurality of upstanding bosses operatively associated with said supporting member and each of said bosses having a recess, a semiconductor wafer disposed in each of said recesses and being sized to be received and accommodated by said recesses, each of said recesses having a tapered wall which merges into said supporting member and forms a recess opening larger than the wafer supported in said recess, said tapered wall merging into a bottom wall which is diametrally smaller than the wafer supported therein so said wafer is supported in spaced relation to said bottom wall, the angle of taper of said tapered wall being such that a substantial portion of the critical surface of said wafer does not contact any portion of the recess when oriented in substantially any position with respect to said bottom wall, and a cover member removably disposed over each of said upstanding bosses, each said cover member having an area which engages the surface of the wafer opposed to said critical surface, each of said bosses having a central bore on its underside to receive and accommodate the upstanding boss on a device disposed immediately therebeneath.

15. A device for retaining relatively thin flat semiconductor wafers and the like which have a critical surface and a surface opposed to said critical surface, said device comprising a supporting member, a cavity forming wall on said supporting member forming a recess sized to accommodate semiconductor wafers and the like, said cavity forming wall including a tapered wall section which is connected to said supporting member and forming a recess opening larger than the wafer to be supported in said recess, said cavity forming wall also including a closure forming base means section operatively merging with said tapered wall section, said closure forminng base means section having an overall size less than the wafer to be supported in said recess and being located so that the wafer is disposed in spaced relation to said base means section, the angle of taper of said tapered wall section being such that only the periphery of the wafer contacts the tapered wall section when located in spaced relation to the bottom wall and that a substantial portion of the critical surface of said wafer does not contact any portion of the recess when oriented in substantially any position with respect to said base means section, a cover member removably disposed over said recess, and means operatively associated with said cover member for engaging the surface of the wafer opposed to said critical surface.

16. The device of claim 15 further characterized in that a plurality of recesses are operatively associated with said supporting member.

17. The device of claim 15 wherein said cover member has a dish-shaped wall including a point-like surface which engages the wafer at a point somewhat centrally thereof.

18. The device of claim 15 further characterized in that said base means section is relatively flat.

19. The device of claim 15 further characterized in that said base means section is arcuate and concave with respect to the interior of said recess.

20. A device for retaining relatively thin flat semiconductor wafers and the like which have a critical surface and a surface opposed to said critical surface, said device comprising a supporting member, a cavity forming wall on said supporting member and forming a recess sized to accommodate semiconductor wafers and the like, said cavity forming wall including a tapered wall section which is connected to said supporting member and forming a recess opening larger than the wafer to be supported in said recess, said cavity forming wall also including a closure forming base means section operatively merging with said tapered wall section, said closure forming base means section having an overall size less than the wafer to be supported in said recess and being located so that the wafer is disposed in spaced relation to said base means section, the angle of taper of said tapered wall section being such that only the periphery of the wafer contacts the tapered wall section when located in spaced relation to the bottom wall and that a substantially air-tight pocket is formed between the critical surface of the wafer and the base means section to maintain a substantially dust-free atmosphere, and a cover member removably disposed over said recess, and means operatively associated with said cover member for engaging the surface of the wafer opposed to said critical surface.

21. The combination of a device for retaining relatively thin flat semiconductor wafers, said wafers having a critical surface and a surface opposed to said critical surface, said device comprising a supporting member, a cavity forming wall on said supporting member and forming a recess, a semiconductor wafer disposed in said recess and being sized to be received and accommodated by said recess, said cavity forming wall including a tapered wall section which is connected to said supporting member and forming a recess opening larger than the wafer supported in said recess, said cavity forming wall also including a closure forming base means section operatively merging with said tapered wall section, said closure forming base means section having an overall size less than the wafer to be supported in said recess and being located so that the wafer is disposed in spaced relation to said base means section, the angle of taper of said tapered wall section being such that only the periphery of the wafer contacts the tapered wall section when located in spaced relation to the bottom wall and that a substantial portion of the critical surface of said wafer does not contact any portion of the recess when oriented in substantially any position with respect to said base means section, a cover member removably disposed over said recess, and means operatively associated with said cover member for engaging the surface of the wafer opposed to said critical surface.

22. The combination of a device for retaining relatively thin flat semiconductor wafers said wafers having a critical surface and a surface opposed to said critical surface, said device comprising a supporting member, a cavity forming wall on said supporting member and forming a recess, a semiconductor wafer disposed in said recess and being sized to be received and accommodated by said recess, said cavity forming wall including a tapered wall section which is connected to said supporting member and forming a recess opening larger than the wafer supported therein, said cavity forming wall also including a closure forming base means section operatively merging with said tapered wall section, said closure forming base wall section having an overall size less than the wafer supported in said recess and being located so that the wafer is disposed in spaced relation to said base wall section, the angle of taper of said tapered wall section being such that only the periphery of the wafer contacts the tapered wall section when located in spaced relation to the bottom wall and that a substantially air-tight pocket is formed between the critical surface of said wafer and the base means section to maintain a substantially dust-free atmosphere, a cover member removably disposed over said recess, and means operatively associated with said cover member for engaging the surface of the wafer opposed to said critical surface.

23. A device for retaining semiconductor wafers and the like, said device comprising a supporting member, said supporting member having at least one recess sized to accommodate semiconductor wafers and the like, said recess having a bottom wall and a tapered wall for supporting said wafer in spaced relation to said bottom wall so that only the periphery of the wafer contacts the tapered wall when located in spaced relation to said bottom wall and a substantial portion of one flat surface of said wafer does not contact said bottom wall, a cover member removably disposed over said upstanding boss, and an insert provided for disposition between a wafer and said cover member.

References Cited

UNITED STATES PATENTS

| | | | |
|---|---|---|---|
| 1,331,263 | 2/1920 | Hunter | 206—18 |
| 3,256,975 | 6/1966 | Puente | 220—60 |
| 3,311,229 | 3/1967 | Troll et al. | 206—56 |

OTHER REFERENCES

I.B.M. Technical Disclosure Bulletin, vol. 8, No. 11, April 1966.

WILLIAM T. DIXSON, Jr., Primary Examiner

U.S. Cl. X.R.

206—46; 220—97; 229—2.5

Disclaimer 3,482,682.—*Paul W. Cronkhite*, St. Charles, Mo. RETAINING TRAYS FOR SEMICONDUCTOR WAFERS AND THE LIKE. Patent dated Dec. 9, 1969. Disclaimer filed Mar. 16, 1970, by the assignee, *Monsanto Company.*

Hereby disclaims the terminal portion of the term of the patent subsequent to Sept. 30, 1986.

[*Official Gazette August 18, 1970.*]